US012719461B2

(12) United States Patent
Boujamaa et al.

(10) Patent No.: US 12,719,461 B2
(45) Date of Patent: Aug. 25, 2026

(54) ADAPTIVE CLOCKING ARCHITECTURE

(71) Applicant: Arm Limited, Cambridge (GB)

(72) Inventors: El Mehdi Boujamaa, Valbonne (FR); Robert Christiaan Schouten, Grasse (FR); Vincent Gouin, Mandelieu (FR)

(73) Assignee: Arm Limited, Cambridge (GB)

( * ) Notice: Subject to any disclaimer, the term of this patent is extended or adjusted under 35 U.S.C. 154(b) by 112 days.

(21) Appl. No.: 18/219,286

(22) Filed: Jul. 7, 2023

(65) Prior Publication Data

US 2025/0015788 A1 Jan. 9, 2025

(51) Int. Cl.
*H03K 5/06* (2006.01)
*H03K 3/037* (2006.01)
*H03K 5/00* (2006.01)

(52) U.S. Cl.
CPC ............... *H03K 5/06* (2013.01); *H03K 3/037* (2013.01); *H03K 2005/00078* (2013.01); *H03K 2005/0015* (2013.01)

(58) Field of Classification Search
CPC ..................... H03K 5/06; H03K 3/037; H03K 2005/00078; H03K 2005/001; H03K 3/017
See application file for complete search history.

(56) References Cited

U.S. PATENT DOCUMENTS

| | | | | |
|---|---|---|---|---|
| 6,255,878 B1 * | 7/2001 | Gauvin | H03K 5/133 327/263 |
| 7,355,465 B2 * | 4/2008 | Gouin | H03K 3/0315 327/261 |
| 10,382,025 B2 * | 8/2019 | Taft | A61B 5/6876 |
| 2022/0166436 A1 * | 5/2022 | Labbe | G06F 1/28 |

* cited by examiner

*Primary Examiner* — Menatoallah Youssef
*Assistant Examiner* — Colleen J O Toole
(74) *Attorney, Agent, or Firm* — Pramudji Law Group PLLC; Ari Pramudji

(57) ABSTRACT

Various implementations described herein are related to a device having adaptive clocking architecture with multiple stages of latches and buffers coupled in a delay line configuration. In some instances, each latch receives a delayed clock signal as data input and provides a sample out signal as a latched output based on a clock signal. Also, in some instances, each latch provides a delayed edge of a next clock cycle so as to stretch the pulse width of the clock signal.

20 Claims, 11 Drawing Sheets

Adaptive Clocking Architecture 104

300A

Adaptive Clocking (Stretch) State Machine (4 Edges in 1 Tck) 304A

300B

Adaptive Clocking (No Stretch) State Machine (4 Edges in 1 Tck) 304B

500A

Adaptive Clocking (Stretch) State Machine (2 Edges in 1 Tck) 504A

500B

Adaptive Clocking (No Stretch) State Machine (2 Edges in 1 Tck) 504B

600A

ADAPTIVE CLOCKING ARCHITECTURE

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In various modern circuit architectures, conventional clocking circuitry typically uses traditional logic circuitry, such as, e.g., buffers and clock gates. In the case of droop mitigation with clock stretching, one type of circuit that can be used is a digital clock divider that divides input clock frequency by an integer number, in situations when a droop is detected. Because a division factor can only be an integer value, the system performance can be greatly reduced if the stretching is triggered too often. On the other hand, without stretching, critical path delays can cause timing failure due to unexpected power supply droops (e.g., higher logic gates delay). Therefore, in some types of circuits, there exists a need for a small, energy and area efficient circuit that can provide clock stretching within a fractional division factor of the clock period.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to elastic clock stretching schemes and/or techniques for various circuit related architectural applications in physical designs. Also, in some implementations, the various elastic clock stretching schemes and techniques described herein provide for a novel adaptive clocking architecture having an adaptive clocking block that reduces system circuit frequency when a power supply droop is detected. The various adaptive clocking schemes and/or techniques described herein use a delay line instead of DLL as a time base to stretch the clock period, which enables stretching to be gate delay based rather than being an absolute fraction of the main clock period. Also, because the delay line can be directly connected to the same power supply on which the droop occurs, the stretch amount may therefore be directly proportional to the droop without any extra processing power. Thus, the elastic stretch solution described herein may therefore be substantially low power since the ADC needed to detect the droop may be removed and the stretching state machine is substantially simple.

Various implementations of adiabatic stepwise clocking techniques for various circuit applications will be described in greater detail herein in FIGS. 1-7.

Figure 1:
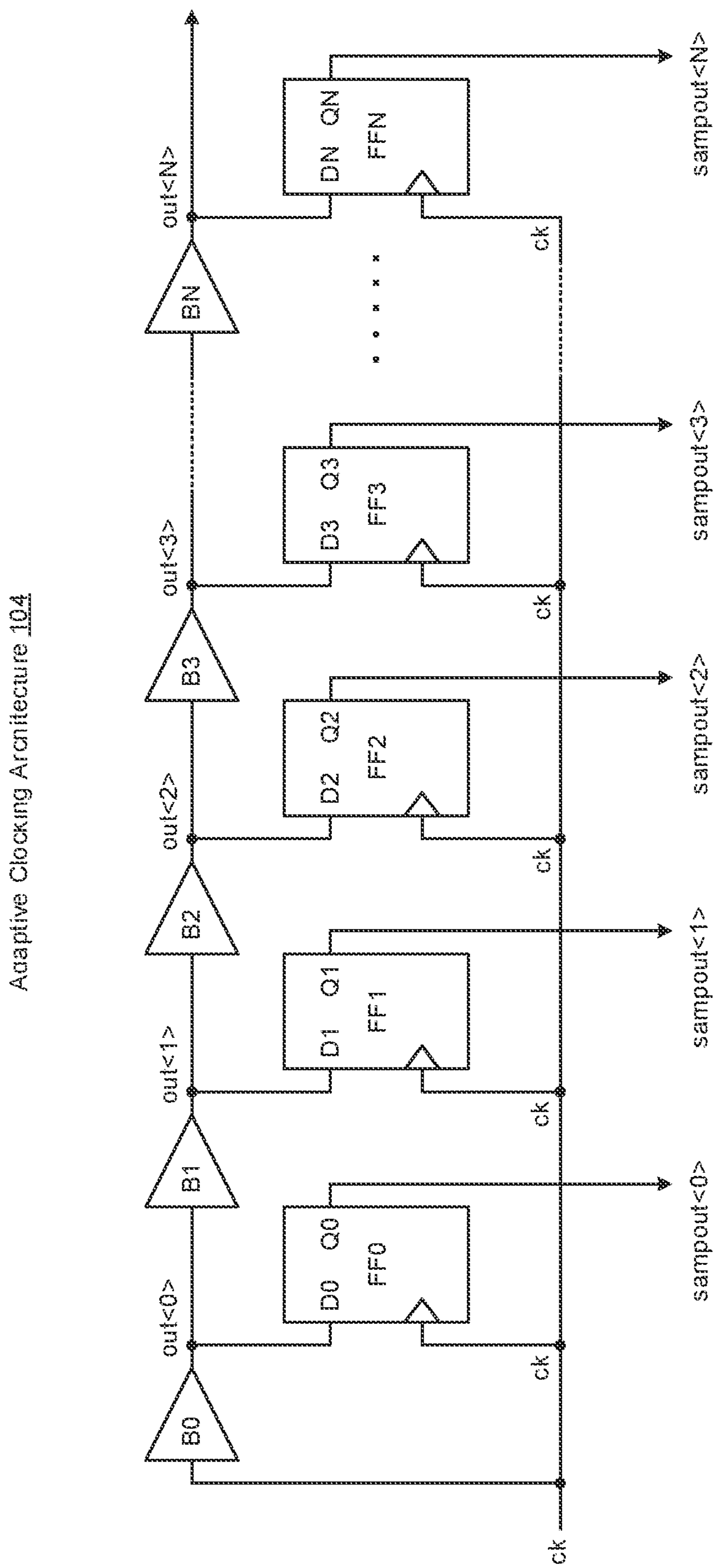
FIG. 1 illustrates a diagram of adaptive clocking architecture in accordance with various implementations described herein.

FIG. 1 illustrates a schematic diagram 100 of adaptive clocking architecture 104 in accordance with various implementations described herein.

In various implementations, the adaptive clocking architecture 104 in FIG. 1 may refer to elastic stretch clocking architecture that may be implemented as a system or a device having various integrated circuit (IC) components that are arranged and coupled together as an assemblage or some combination of parts that provide for physical circuit designs and related structures. In some instances, a method of designing, providing and fabricating the adaptive clocking architecture 104 as an integrated system or device may involve use of various IC circuit components and/or structures described herein so as to implement fabrication schemes and techniques associated therewith. Also, the adaptive clocking architecture 104 may be integrated with various computing circuitry and related components on a single chip, and in addition, the adaptive clocking architecture 104 may be implemented in embedded systems and/or devices for automotive, mobile, computer, server and Internet-of-things (IoT) applications, including remote sensor nodes.

As shown in FIG. 1, the adaptive clocking architecture 104 may refer to elastic stretch clocking architecture for various circuit related applications. The adaptive clocking architecture 104 may include multiple stages of latches (FF0, FF1, . . . , FFN) and buffers (B0, B1, . . . , BN) coupled in a delay line configuration, wherein the latches (FF0, FF1, . . . , FFN) may include flip-flops (FFs) or various types of similar circuits. Also, each latch (FF0, FF1, . . . , FFN) may receive a delayed clock signal (out<0>, out<1>, . . . , out<N>) as data input (D0, D1, . . . , DN) and then provide a sample out signal (sampout<0>, sampout<1>, . . . , sampout<N>) as a latched output (Q0, Q1, . . . , QN) based on a clock signal (ck). Also, each latch (FF0, FF1, . . . , FFN) may provide a delayed edge of a next clock cycle so as to stretch the pulse width (or pulse period) of the clock signal (ck). In some instances, the sample out signal (sampout<i>) may be used to capture the position of the clock pulse in the delay line, and thus, sampout<i> effectively captures the position of the clock edge in the delay line (for each clock cycle). Also, in various applications, the multiple stages may include any number of stages, the latches (FF0, FF1, . . . , FFN) may include any number of latches, and the buffers (B0, B1, . . . , BN) may include any number of buffers. Also, any type of latch may be used.

In various implementations, the latches (FF0, FF1, . . . , FFN) may provide the sample out signals (sampout<0>, sampout<1>, . . . , sampout<N>) as sampling outputs (sampouts) so as to thereby generate a series of clock cycles of the clock signal (ck) with a stretched pulse width (or stretched pulse period). The series of clock cycles may include a series of delayed edges for each corresponding clock cycle so as to stretch the pulse width (or pulse period) of the clock signal (ck). Also, each latch (FF0, FF1, . . . , FFN) may provide a corresponding delayed clock pulse position in the delay line of the sample out signal (sampout<0>, . . . , sampout<N>) beginning with a starting edge of the latched output (Q0, Q1, . . . , QN) based on the clock signal (ck), and each latch (FF0, FF1, . . . , FFN) may provide the starting edge of the latched output (Q0, Q1, . . . , QN) as the sampling output (sampout) so as to select the series of clock cycles and delayed clock edges that will stretch the clock pulse width (or pulse period). Also, the series of clock cycles of the clock signal (ck) refers to a series of multiple clock cycles of the clock signal (ck) including a number of clock cycles that repeat.

In various implementations, the multiple stages of latches (FF0, FF1, . . . , FFN) and buffers (B0, B1, . . . , BN) may include a number of stages including a first stage with a first latch (FF0) and a first buffer (B0). The first buffer (B0) may receive the clock signal (ck) and provide a first delayed clock signal (out<0>) as a first data input (DO) to the first latch (FF0). Also, the first latch (FF0) may receive the first delayed clock signal (out<0>) and provide a first sample out signal (sampout<0>) as a first latched output (Q0) based on the clock signal (ck).

In various implementations, the multiple stages of latches (FF0, FF1, . . . , FFN) and buffers (B0, B1, . . . , BN) may include a second stage with a second latch (FF1) and a second buffer (B1). The second buffer (B1) may receive the first delayed clock signal (out<0>) and provide a second delayed clock signal (out<1>) as a second data input (D1) to the second latch (FF1). Also, the second latch (FF1) may receive the second delayed clock signal (out<1>) and then provide a second sample out signal (sampout<1>) as a second latched output (Q1) based on the clock signal (ck).

In various implementations, the multiple stages of latches (FF0, FF1, . . . , FFN) and buffers (B0, B1, . . . , BN) may include a third stage with a third latch (FF2) and a third buffer (B2). The third buffer (B2) may receive the second delayed clock signal (out<1>) and provide a third delayed clock signal (out<2>) as a third data input (D2) to the third latch (FF2). Also, the third latch (FF2) may receive the third delayed clock signal (out<2>) and then provide a third sample out signal (sampout<2>) as a third latched output (Q2) based on the clock signal (ck).

In various implementations, the multiple stages of latches (FF0, FF1, . . . , FFN) and buffers (B0, B1, . . . , BN) may include a fourth stage with a fourth latch (FF3) and a fourth buffer (B3). Also, the fourth buffer (B3) may receive the third delayed clock signal (out<2>) and provide a fourth delayed clock signal (out<3>) as a fourth data input (D3) to the fourth latch (FF3). Also, the fourth latch (FF3) may receive the fourth delayed clock signal (out<3>) and then provide a fourth sample out signal (sampout<3>) as a fourth latched output (Q3) based on the clock signal (ck).

In various implementations, the multiple stages of latches (FF0, FF1, . . . , FFN) and buffers (B0, B1, . . . , BN) may include a number (N) of additional stages with each additional stage having an additional latch (FFN) and an additional buffer (BN). Also, each additional buffer (BN) may receive a previous delayed clock signal (out<N−1>) from a previous buffer (BN−1) and provide another delayed clock signal (out<N>) as another data input (DN) to each additional latch (FFN). Further, each additional latch (FFN) may receive the delayed clock signal (out<N>) and then provide another sample out signal (sampout<N>) as a latched output (QN) based on the clock signal (ck). Also, in various applications, the buffers (B0, B1, . . . , BN) may be any type of delay element and/or gate that is used to delay the clock signal (ck), such as, e.g., AND gate, OR gate, etc.

Figure 2:
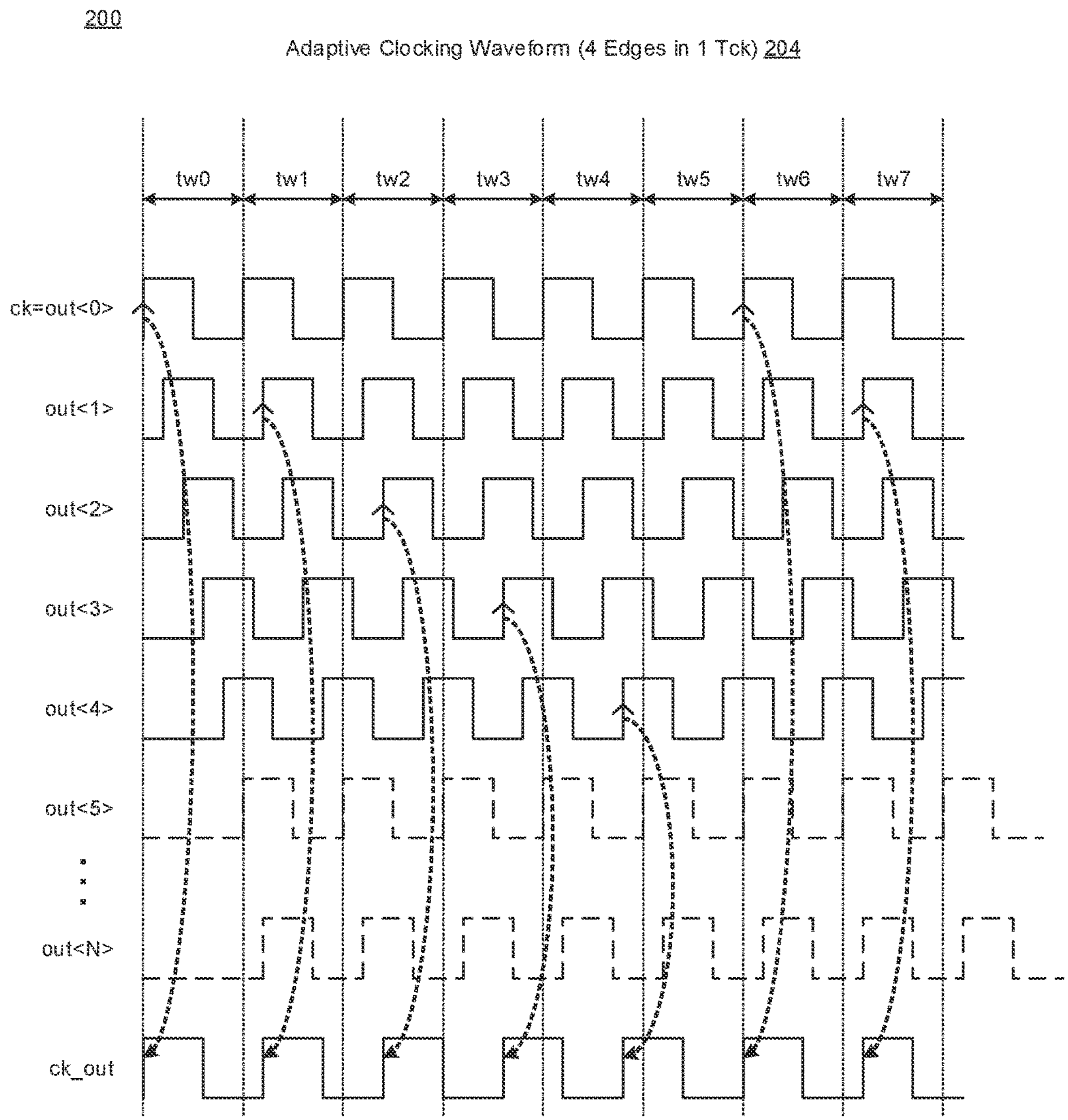
FIG. 2 illustrates a diagram of an adaptive clocking waveform in accordance with various implementations described herein.

FIG. 2 illustrates a signal diagram 200 of an adaptive clocking waveform 204 in accordance with various implementations described herein. In various applications, the adaptive clocking architecture 104 in FIG. 1 may be used to describe various transitional states (0, 1) of the signal (or waveform) diagram 200.

As shown in FIG. 2, the waveform diagram 200 shows multiple timing periods (e.g., tw0, tw1, . . . , tw7) that provide pulse triggering of the adaptive clocking architecture 104 in FIG. 1. In some instances, each rising-edge signal (as defined by each up-arrow) within each timing period (tw0, tw1, . . . , tw7) may refer to a single pulse within each timing period (tw0, tw1, . . . , tw7) that is used to trigger the rising-edge pulse of the ck_out signal within each timing window (tw0, tw1, . . . , tw7).

For instance, in timing window tw0, delayed clock signal (ck=out<0>) triggers the rising edge of the ck_out signal, and in timing window tw1, the delayed clock signal (out<1>) triggers the rising edge of the ck_out signal. Also, in timing window tw2, delayed clock signal (out<2>) triggers the rising edge of the ck_out signal, and in timing window tw3, the delayed clock signal (out<3>) triggers the rising edge of the ck_out signal. Also, in timing window tw4, delayed clock signal (out<4>) triggers the rising edge of the ck_out signal, and these multiple timing sequences of tw0 to tw4 may repeat itself over the next timing windows. For instance, in timing window tw6, the delayed clock signal (ck=out<0>) triggers the rising edge of the ck_out signal, and in timing window tw7, the delayed clock signal (out<1>) triggers the rising edge of the ck_out signal.

In some implementations, the adaptive clocking waveform 204 may provide for 4 edges in 1 Tck (i.e., clock cycle timing periods). However, any number (N) of edges for any number of clock cycle timing periods may b e used to generate the ck_out signal.

Figure 3A:
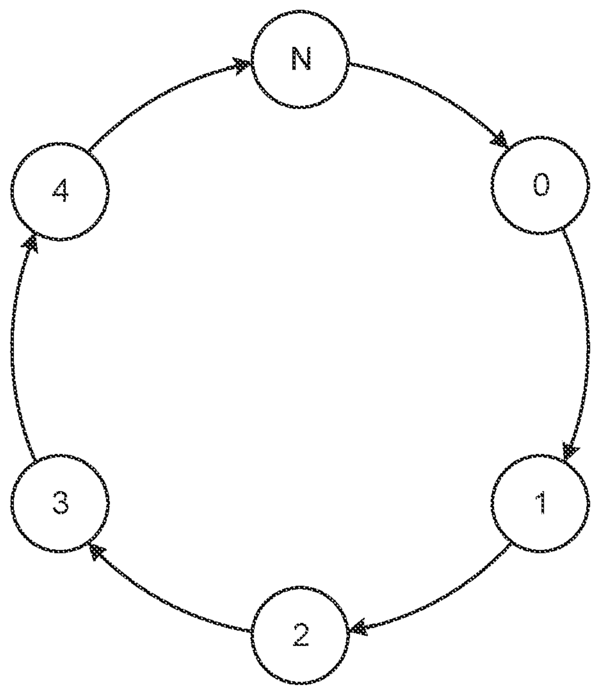
FIGS. 3A-3B illustrate various diagrams of adaptive clocking state machines in accordance with various implementations described herein.
Figure 3B:
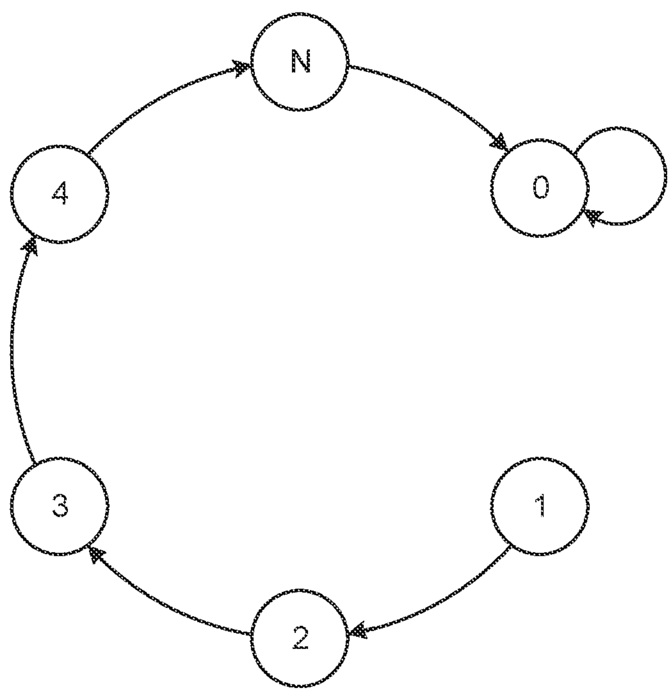

FIGS. 3A-3B illustrate various diagrams of adaptive clocking state machines in accordance with various implementations described herein. In some implementations, FIGS. 3A-3B show examples of adaptive clocking state machine diagrams for stretching the ck_out signal where the clock is stretched by one clock edge AND there are 4 clock edges available in one clock cycle. Nevertheless, the adaptive clocking state machine diagram for stretching the ck_out may be stretch by an arbitrary number of clock edges AND the number of clock edges per clock cycle may also be arbitrary (depending on delay line, voltage, clock frequency and/or temperature.

FIG. 3A shows a state machine diagram 300A for use with adaptive clocking architecture in accordance with various implementations described herein. Also, in some applications, the adaptive clocking architecture 104 in FIG. 1 may be used to describe various transitional states (0, 1, 2, 3, 4, N) of the state machine diagram 300A. In some instances, N may refer to a neutral state; however, this neutral state may refer to an idle state, which may be referenced as idle (I).

As shown in FIG. 3A, the state machine diagram 300A refers to an adaptive clocking state machine diagram for stretching the ck-out signal with 4 edges in 1 Tck using the multiple transitional logic states, including, e.g., first logic state (0), second logic state (1), third logic state (2), fourth logic state (3), fifth logic state (4) and Nth logic state. Also, the first logic state (0) may refer to a selected state that transitions to the second logic state (1), and the second logic state (1) may refer to a selected state that transitions to the third logic state (2). Also, the third logic state (2) may refer to a selected state that transitions to the fourth logic state (3), and the fourth logic state (3) may refer to a selected state that transitions to the fifth logic state (4). Also, the fifth logic state (4) may refer to a selected state that transitions to the Nth logic state (N). Also, the Nth logic state (N) may refer to a selected state that transitions (or repeats) back to the first logic state (0).

FIG. 3B shows a state machine diagram 300B for use with adaptive clocking architecture in accordance with various implementations described herein. Also, in some applications, the adaptive clocking architecture 104 in FIG. 1 may be used to describe various transitional states (0, 1, 2, 3, 4, N) of the state machine diagram 300B.

As shown in FIG. 3B, the state machine diagram 300B refers to an adaptive clocking state machine diagram for not stretching the ck-out signal with 4 edges in 1 Tck using the multiple transitional logic states, including, e.g., first logic state (0), second logic state (1), third logic state (2), fourth logic state (3), fifth logic state (4) and Nth logic state. Also, the first logic state (0) may refer to a selected state that transitions (or returns) back to itself. Also, the second logic state (1) may refer to a selected state that transitions to the third logic state (2), and the third logic state (2) may refer to a selected state that transitions to the fourth logic state (3). The fourth logic state (3) may refer to a selected state that transitions to the fifth logic state (4), and the fifth logic state (4) may refer to a selected state that may transition to the Nth logic state (N), or Neutral (N) state. Also, the Nth logic state (N) may refer to a selected state that transitions to the first logic state (0).

Figure 4:
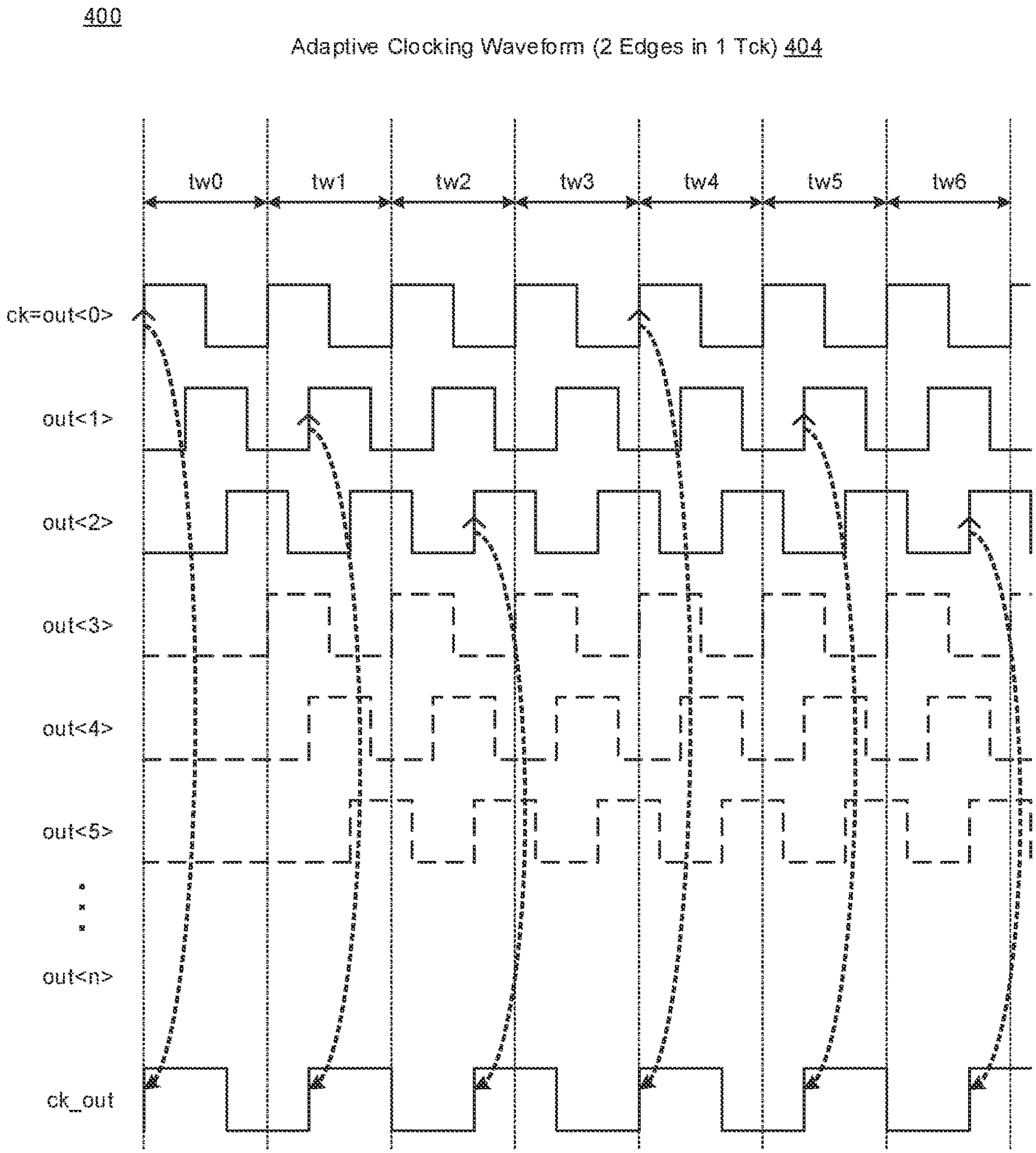
FIG. 4 illustrates a diagram of an adaptive clocking waveform in accordance with various implementations described herein.

FIG. 4 illustrates a signal diagram 400 of an adaptive clocking waveform 404 in accordance with various implementations described herein. In various applications, the adaptive clocking architecture 104 in FIG. 1 may be used to describe various transitional states (0, 1) of the signal (or waveform) diagram 400.

As shown in FIG. 4, the waveform diagram 400 shows multiple timing periods (e.g., tw0, tw1, . . . , tw6) that provide pulse triggering of the adaptive clocking architecture 104 in FIG. 1. In some instances, each rising-edge signal (as defined by each up-arrow) within each timing period (tw0, tw1, . . . , tw6) may refer to a single pulse within each timing period (tw0, tw1, . . . , tw6) that is used to trigger the rising-edge pulse of the ck_out signal within each timing window (tw0, tw1, . . . , tw6).

For instance, in timing window tw0, delayed clock signal (ck=out<0>) triggers the rising edge of the ck_out signal, and in timing window tw1, the delayed clock signal (out<1>) triggers the rising edge of the ck_out signal, and in timing window tw2, delayed clock signal (out<2>) triggers the rising edge of the ck_out signal, and also, these multiple timing sequences of tw0 to tw2 may repeat over the next timing windows. For instance, in timing window tw4, the delayed clock signal (out<0>) triggers the rising edge of the ck_out signal, and in timing window tw5, delayed clock signal (out<1>) triggers the rising edge of the ck_out signal, and in timing window tw6, delayed clock signal (out<2>) triggers the rising edge of the ck_out signal, and these multiple timing sequences of tw4 to tw6 may repeat itself in a similar manner over the next timing windows.

In some implementations, the adaptive clocking waveform 404 may provide for 2 edges in 1 Tck (i.e., clock cycle timing periods). However, any number (N) of edges for any number of clock cycle timing periods may b e used to generate the ck_out signal.

Figure 5A:
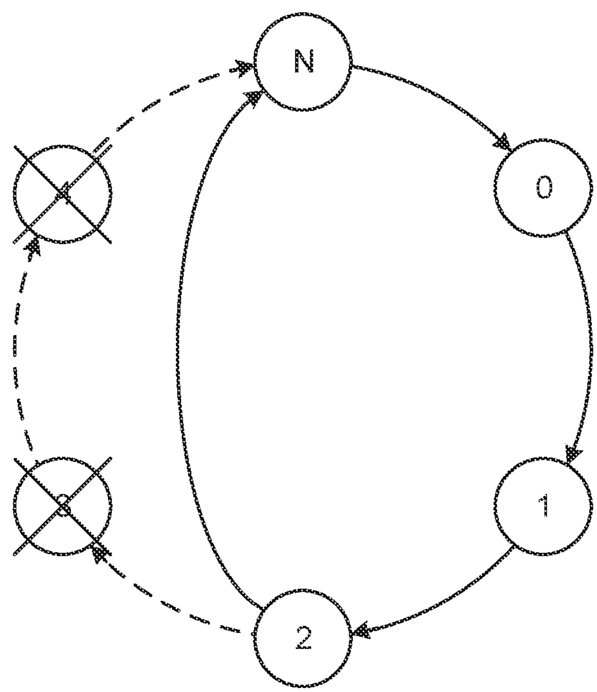
FIGS. 5A-5B illustrate various diagrams of adaptive clocking state machine in accordance with various implementations described herein.
Figure 5B:
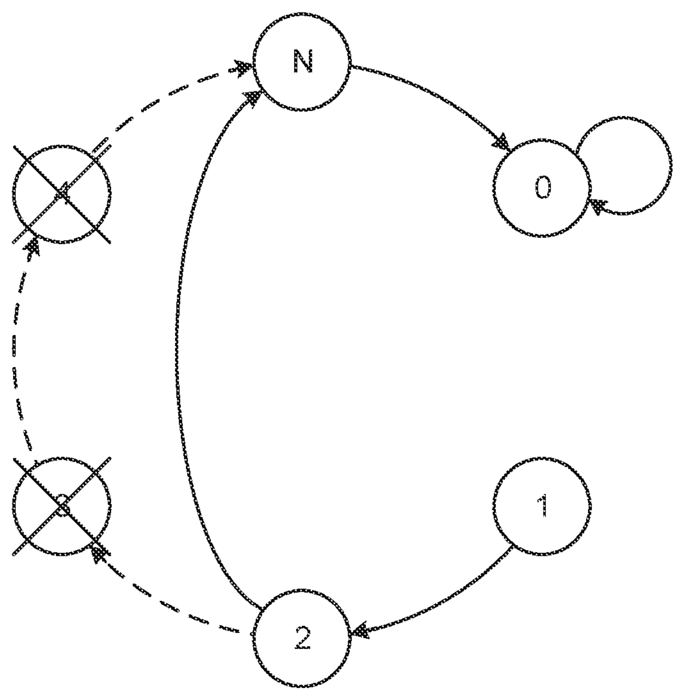

FIGS. 5A-5B illustrate various diagrams of adaptive clocking state machines in accordance with various implementations described herein.

FIG. 5A illustrates a state machine diagram 500A of an adaptive clocking state machine 504A for use with the adaptive clocking architecture in accordance with various implementations described herein. Moreover, in some applications, the adaptive clocking architecture 104 in FIG. 1 may be used to describe various transitional states (0, 1, 2, N) of the state machine diagram 500A.

As shown in FIG. 5A, state machine diagram 500A includes an adaptive clocking state machine diagram for stretching the ck-out signal with 2 edges in 1 Tck using multiple transitional logic states, including, e.g., first logic state (0), second logic state (1), third logic state (2), and Nth logic state, or Neutral (N) state. In various instances, the first logic state (0) may refer to a selected state that transitions to the second logic state (1), and the second logic state (1) may refer to a selected state that transitions to the third logic state (2). Also, the third logic state (2) may refer to a selected state that transitions to the Nth logic state (N). Also, the Nth logic state (N) may refer to a selected state that transitions (or repeats) back to the first logic state (0).

FIG. 5B illustrates a state machine diagram 500B of an adaptive clocking state machine 504B for use with the adaptive clocking architecture in accordance with various implementations described herein. Moreover, in some applications, the adaptive clocking architecture 104 in FIG. 1 may be used to describe various transitional states (0, 1, 2, N) of the state machine diagram 500B.

As shown in FIG. 5B, state machine diagram 500B includes an adaptive clocking state machine diagram for not stretching the ck-out signal with 2 edges in 1 Tck using multiple transitional logic states, including, e.g., first logic state (0), second logic state (1), third logic state (2), and Nth logic state. In various instances, the first logic state (0) may refer to a selected state that transitions (or returns) back to itself, and the second logic state (1) may refer to a selected state that transitions to the third logic state (2). Also, the third logic state (2) may refer to a selected state that transitions to the Nth logic state (N). Also, the Nth logic state (N) may refer to a selected state that transitions (or repeats) back to the first logic state (0).

Figure 6A:
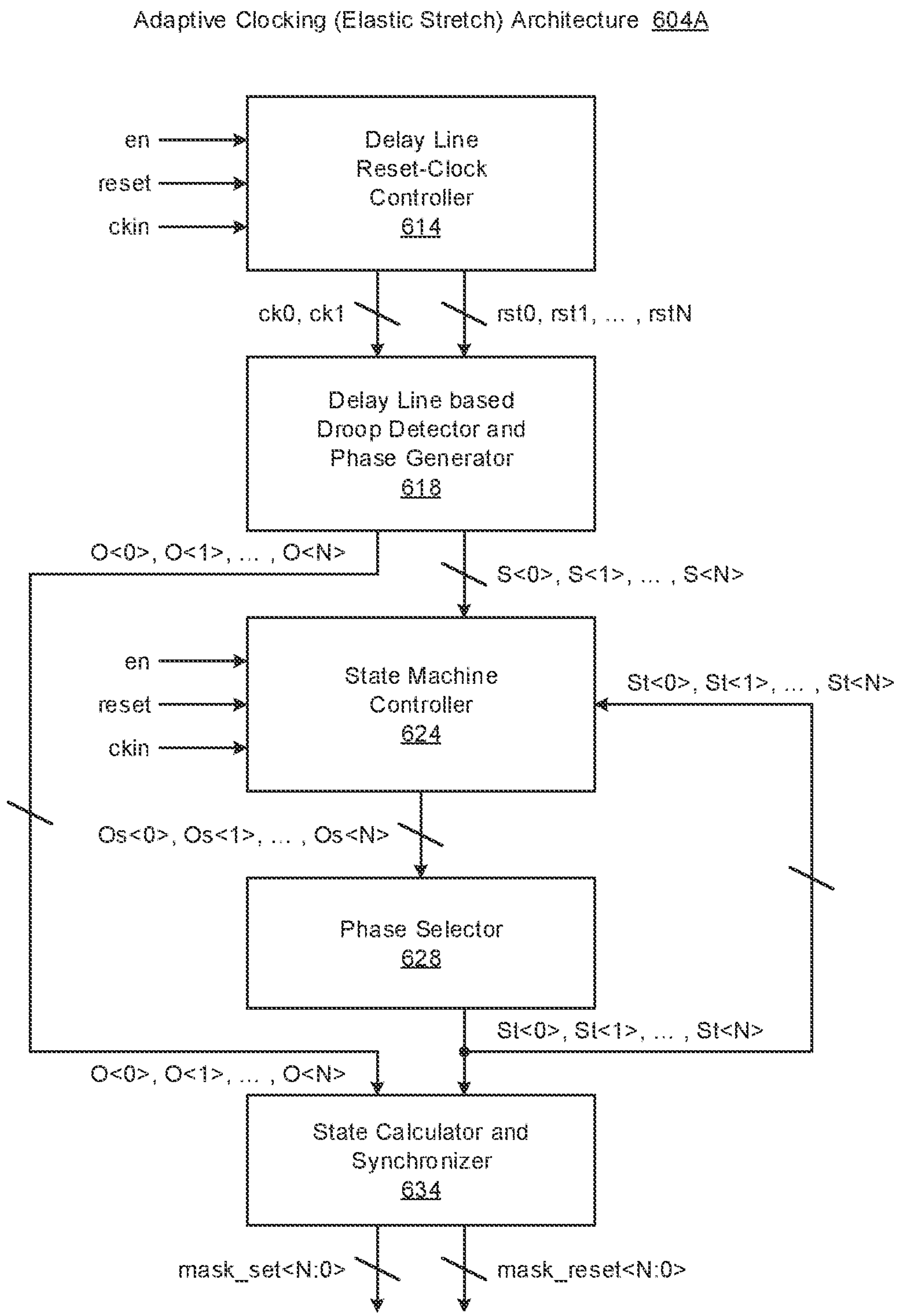
FIGS. 6A-6C illustrate various diagrams of adaptive clocking architecture and related circuitry in accordance with various implementations described herein.
Figure 6B:
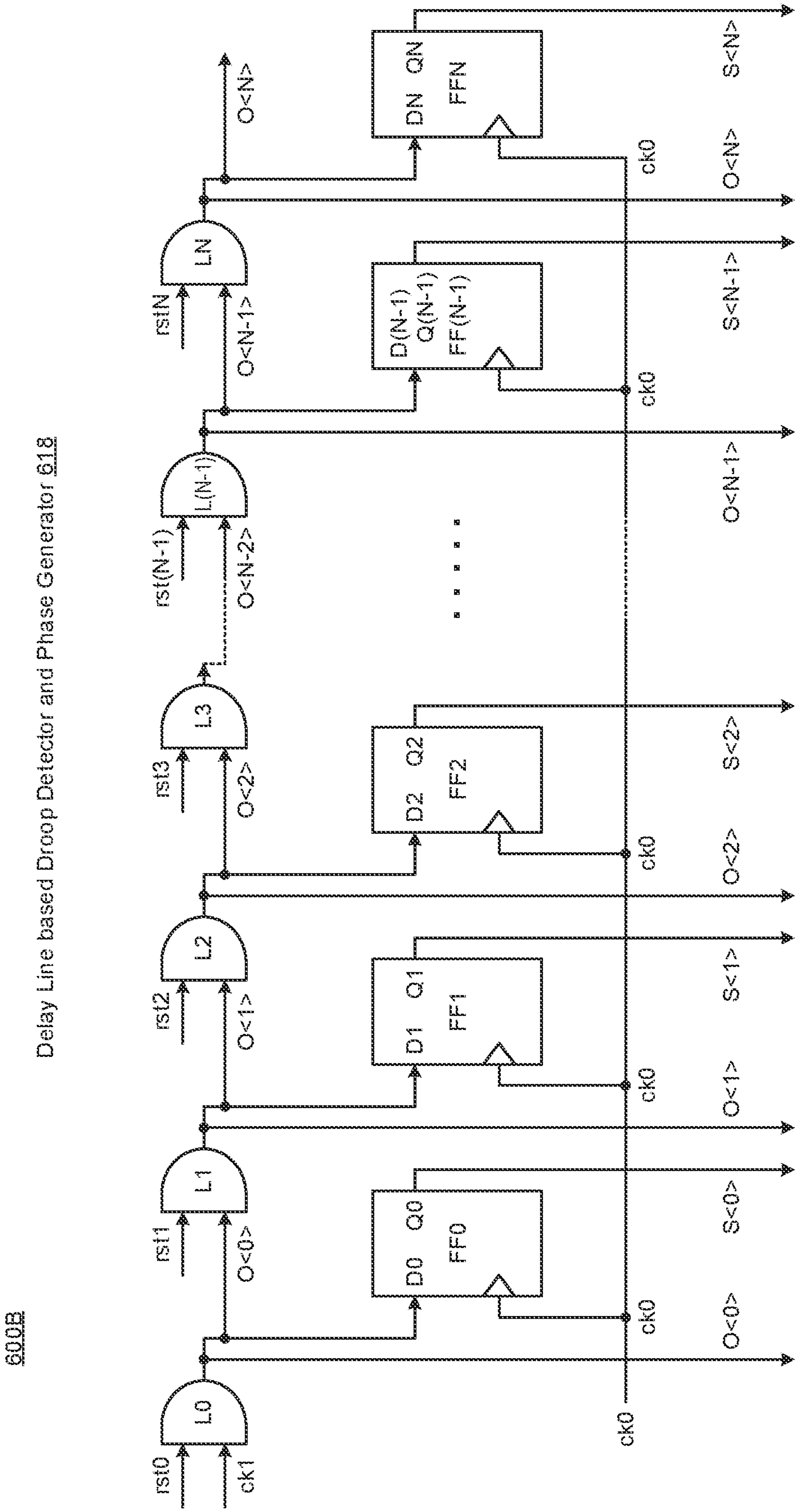
Figure 6C:
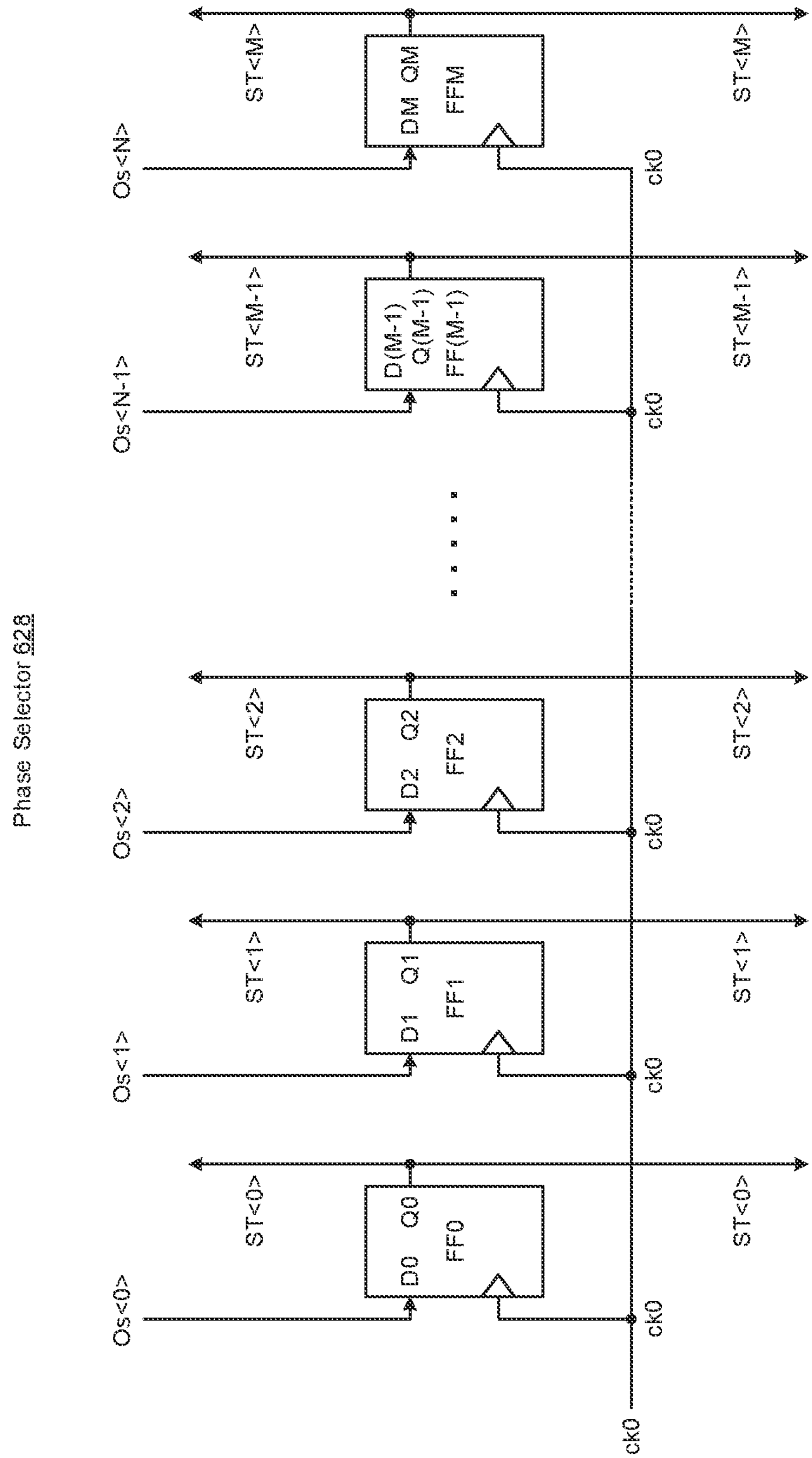

FIGS. 6A-6C illustrate various diagrams of adaptive clocking architecture and related circuitry in accordance with various implementations described herein.

FIG. 6A illustrates a schematic diagram 600A of adaptive clocking (elastic stretch) architecture 604A in accordance with implementations described herein.

In some implementations, the adaptive clocking architecture 604A in FIG. 6A may refer to elastic stretch clocking architecture that may be implemented as a system or a device having various integrated circuit (IC) components that are arranged and coupled together as an assemblage or some combination of parts that provide for physical circuit designs and related structures. In some instances, a method of designing, providing and fabricating the adaptive clocking architecture 604A as an integrated system or device may involve use of various IC circuit components and/or structures described herein so as to implement fabrication schemes and techniques associated therewith. Also, the adaptive clocking architecture 604A may be integrated with various computing circuitry and related components on a single chip, and also, the adaptive clocking architecture 604A may be implemented in embedded systems and/or devices for automotive, mobile, computer, server and Internet-of-things (IoT) applications, including remote sensor nodes.

As shown in FIG. 6A, the adaptive clocking architecture 604A may refer to elastic stretch clocking architecture for various circuit related applications. The adaptive clocking architecture 604A may include a delay line reset-clock controller 614, a delay line based droop detector and phase generator 618, a state machine controller 624, a phase selector 628, and a state calculator and synchronizer 634. Additional scope, features and circuitry related to delay line based droop detector and phase generator 618 is described herein in reference to FIG. 6B. Also, additional scope, features and circuitry related to the phase selector 628 is described herein in reference to FIG. 6C.

In some implementations, the delay line reset-clock controller 614 may refer to a clock controller that provides clock signals (ck0, ck1) and reset signals (rst0, rst1, . . . , rstN) based on an enable signal (en), an input reset signal (reset) and an input clock signal (ckin). The delay line based droop detector and phase generator 618 may refer to a phase generator that may generate output signals (O<0>, O<1>, . . . O<N>) and sampling signals (S<0>, S<1>, . . . S<N>) based on the clock signals (ck0, ck1) and the reset signals (rst0, rst1, . . . , rstN) from the clock controller 614. The phase generator 618 may have multiple stages of latches and logic gates coupled in a delay line configuration. Also, each latch may receive a delayed clock signal as data input and provide a sample out signal as a latched output based on a clock signal. Also, each latch may provide a delayed edge of a next clock cycle so as to stretch the pulse width (or pulse period) of the clock signal.

In some implementations, the state machine controller 624 may receive sampling signals (S<0>, S<1>, . . . S<N>) from the phase generator 618, receive sampling signals (St<0>, St<1>, . . . St<N>) from the phase selector 628 (as feedback signals), and then provide the output signals (Os<0>, Os<1>, . . . Os<N>) based on the enable signal (en), the input reset signal (reset) and the input clock signal (ckin). Also, the phase selector 628 may receive the output signals (Os<0>, Os<1>, . . . Os<N>) from the state machine controller 624 and then provide the sampling signals (St<0>, St<1>, . . . St<N>) to the state machine controller 624 (as feedback signals). Also, the state calculator and synchronizer 634 may receive output signals (O<0>, O<1>, . . . O<N>) from the phase generator 618, receive sampling signals (St<0>, St<1>, . . . St<N>) from the phase selector 628, and then provide mask set signals (mask_set<N:0>) and mask reset signals (mask_reset<N:0>) as output.

FIG. 6B illustrates a diagram 600B of the delay line based droop detector and phase generator 618 in accordance with various implementations described herein.

In some implementations, the detector-generator circuitry 618 in FIG. 6B may refer to elastic stretch clocking architecture that may be implemented as a system or a device having various integrated circuit (IC) components that are arranged and coupled together as an assemblage or some combination of parts that provide for physical circuit designs and related structures. In some instances, a method of designing, providing and fabricating the detector-generator circuitry 618 as an integrated system or device may involve use of various IC circuit components and/or structures described herein so as to implement fabrication schemes and techniques associated therewith. Also, the detector-generator circuitry 618 may be integrated with various computing circuitry and related components on a single chip, and in addition, the detector-generator circuitry 618 may be implemented in embedded systems and/or devices for automotive, mobile, computer, server and Internet-of-things (IoT) applications, including remote sensor nodes.

As shown in FIG. 6B, detector-generator circuitry 618 of the delay line based droop detector and phase generator 618 may refer to elastic stretch clocking architecture for various circuit related applications. The detector-generator circuitry 618 may include multiple stages of latches (FF0, FF1, . . . , FFN) and logic gates (L0, L1, . . . , LN) coupled in a delay line configuration, wherein the latches (FF0, FF1, . . . , FFN) may include flip-flops (FFs) or various types of similar circuits. Also, each logic gate (L0, L1, . . . , LN) may provide a delayed clock signal (O<0>, O<1>, . . . , O<N>) based on a reset signal (rst0, rst1, . . . , rstN). Also, the signals (S<i>) may represent a latched value of a maximum position of the pulse in the delay line. Also, each latch (FF0, FF1, . . . , FFN) may provide the position of the pulse in the delay line so that the clock stretching state calculation may be performed.

In various implementations, the latches (FF0, FF1, . . . , FFN) may provide the sample out signals (O<0>, O<1>, . . . , O<N>) as a sampling output (sampout) so as to calculate the needed series of clock cycles of the clock signal (ck) to generate a stretched signal period (or stretched pulse width). Also, the series of clock cycles of the clock signal (ck) may refer to a series of multiple clock cycles of the clock signal (ck) including a number (N) of clock cycles that repeat. Also, the series of clock cycles may have a series of delayed edges for each corresponding clock cycle so as to stretch the pulse period (or pulse width) of the clock signal (ck). Also, each latch (FF0, FF1, . . . , FFN) may provide a corresponding sampled clock signal beginning with a starting edge of the latched output (Q0, Q1, . . . , QN) based on the clock signal (ck). Also, each latch (FF0, FF1, . . . , FFN) may provide the starting edge of the latched output (Q0, Q1, . . . , QN) as the sampling output (sampout) so as to generate the series of clock cycles with the stretched pulse width.

In various implementations, the multiple stages of latches (FF0, FF1, . . . , FFN) and logic gates (L0, L1, . . . , LN) may include a first stage with a first latch (FF0) and a first logic gate (L0). Also, the first logic gate (L0) may receive the clock signal (ck), receive a first reset signal (rst0), and provides a first delayed clock signal (O<0>) as a first data input (DO) to the first latch (FF0). Also, the first latch (FF0) may receive the first delayed clock signal (O<0>) and provide a first sample out signal (S<0>) as a first latched output (Q0) based on the clock signal (ck).

In various implementations, the multiple stages of latches (FF0, FF1, . . . , FFN) and logic gates (L0, L1, . . . , LN) may include a second stage with a second latch (FF1) and a second logic gate (L1). The second logic gate (L1) may receive first delayed clock signal (O<0>), receive a second reset signal (rst1), and provide a second delayed clock signal (O<1>) as a second data input (D1) to the second latch (FF1). The second latch (FF1) may receive the second delayed clock signal (O<1>) and provide a second sample out signal (S<1>) as a second latched output (Q1) based on the clock signal (ck).

In various implementations, the multiple stages of latches (FF0, FF1, . . . , FFN) and logic gates (L0, L1, . . . , LN) may include a third stage with a third latch (FF2) and a third logic gate (12). Also, the third logic gate (12) may receive the second delayed clock signal (O<1>), receive a third reset signal (rst2), and provide a third delayed clock signal (O<2>) as a third data input (D2) to the third latch (FF2). Also, the third latch (FF2) may receive the third delayed clock signal (O<2>) and provide a third sample out signal (S<2>) as a third latched output (Q2) based on the clock signal (ck).

In various implementations, the multiple stages of latches (FF0, FF1, . . . , FFN) and logic gates (L0, L1, . . . , LN) may include an Nth stage with an Nth latch (FF(N−1)) and an Nth logic gate (L(N−1)). For example, N may be four. A fourth logic gate (L(N−1)) may receive the third delayed clock signal (O<2>), receive a fourth reset signal (rst(N−1)), and provide a fourth delayed clock signal (O<N−1>) as a fourth data input (D(N−1) to the fourth latch (FF(N−1)). Also, the fourth latch (FF(N−1)) may receive the fourth delayed clock signal (O<N−1>) and provide a fourth sample out signal (S<N−1>) as a fourth latched output (Q(N−1)) based on the clock signal (ck).

In various implementations, the multiple stages of latches (FF0, FF1, . . . , FFN) and logic gates (L0, L1, . . . , LN) may include a number (N) of additional stages with each additional stage having an additional latch (FFN) and an additional logic gate (LN). Also, each additional logic gate (LN) may receive another delayed clock signal (O<N>) from a previous logic gate (L(N−1)) and provide the delayed clock signal (O<N>) as another data input (DN) to each additional latch (FFN). Also, each additional latch (FFN) may receive the delayed clock signal (O<N>) and provide a sample out signal (S<N>) as a latched output (QN) based on the clock signal (ck).

FIG. 6C illustrates a schematic diagram 600C of the phase selector 628 in accordance with various implementations described herein.

In various implementations, the phase selector 628 in FIG. 6C may refer to elastic stretch clocking architecture that may be implemented as a system or a device having various integrated circuit (IC) components that are arranged and coupled together as an assemblage or some combination of parts that provide for physical circuit designs and related structures. In some instances, method of designing, providing and fabricating the phase selector 628 as an integrated system or device may involve use of various IC circuit components and/or structures described herein so as to implement fabrication schemes and techniques associated therewith. Also, the phase selector 628 may be integrated with various computing circuitry and related components on a single chip, and in addition, the phase selector 628 may be implemented in embedded systems and/or devices for automotive, mobile, computer, server and Internet-of-things (IoT) applications, including remote sensor nodes.

As shown in FIG. 6C, the phase selector 628 may include multiple stages of latches (FF0, FF1, FF2, . . . , FF(M−1), FFM) that receive output signals (Os<0>, Os<1>, . . . Os<N>) as data input signals (D0, D1, D2, . . . , D(M−1), DM), receive the clock signal (ck0) as a clock input, and then provide state signals (ST<0>, ST<1>, ST<2>, . . . , ST<M−1>, ST<M>) as data output signals (Q0, Q1, Q2, . . . Q(M−1), QM). As shown in FIG. 6A, the phase selector 628 may receive the output signals (Os<0>, Os<1>, . . . O<N>) from the state machine controller 624 and provide the state signals (ST<0>, ST<1>, ST<2>, . . . , ST<M−1>, ST<M>) to the state calculator and synchronizer 634.

Figure 7:
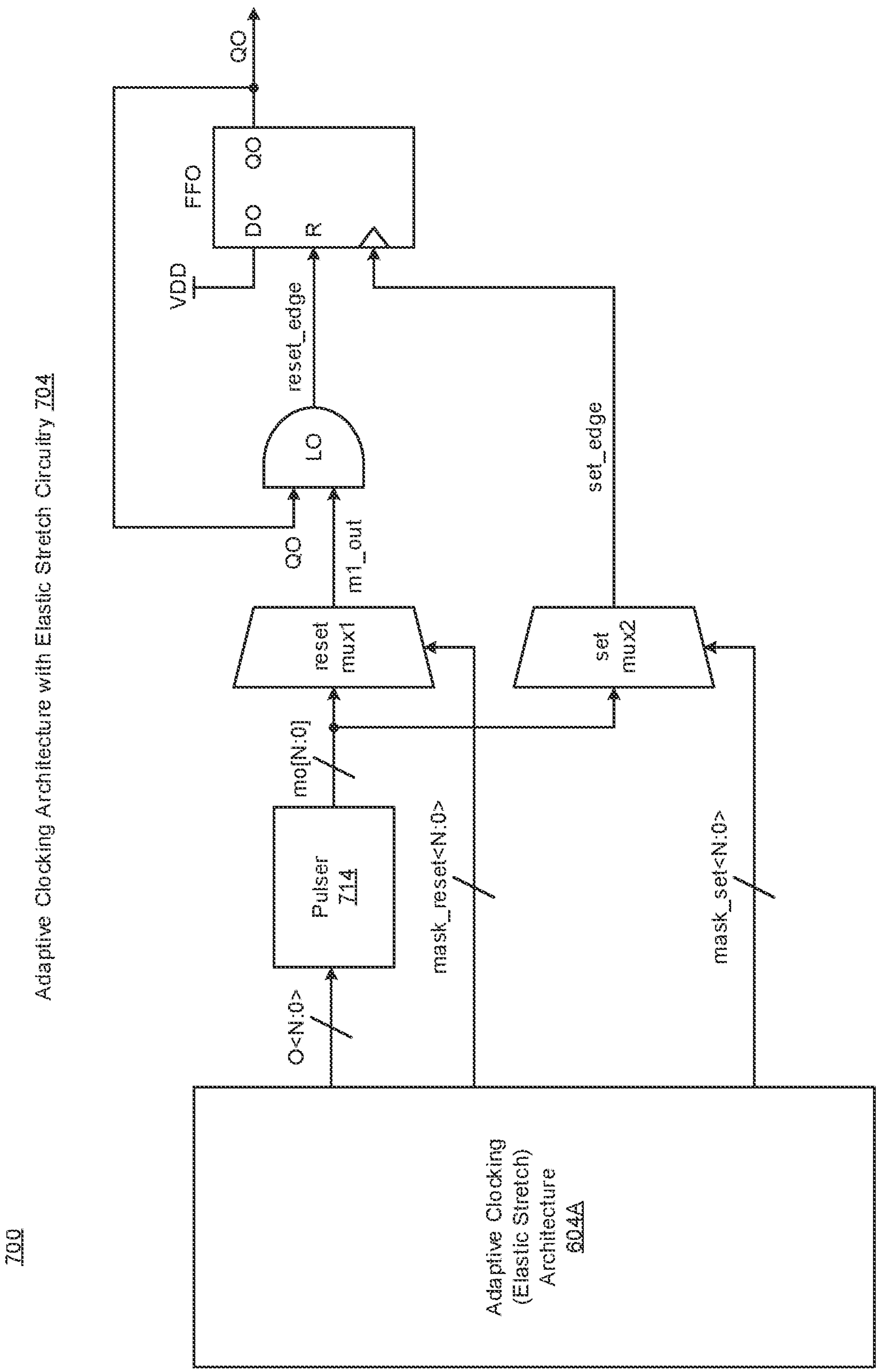
FIG. 7 illustrates a diagram of adaptive clocking architecture with elastic stretch circuitry in accordance with various implementations described herein.

FIG. 7 illustrates a schematic diagram 700 of adaptive clocking architecture 704 with elastic stretch circuitry in accordance with implementations described herein.

In various implementations, the adaptive clocking architecture 704 in FIG. 7 may refer to elastic stretch clocking architecture that may be implemented as a system or a device having various integrated circuit (IC) components that are arranged and coupled together as an assemblage or some combination of parts that provide for physical circuit designs and related structures. In some instances, a method of designing, providing and fabricating the adaptive clocking architecture 704 as an integrated system or device may involve use of various IC circuit components and/or structures described herein so as to implement fabrication schemes and techniques associated therewith. Also, the adaptive clocking architecture 704 may be integrated with various computing circuitry and related components on a single chip, and in addition, the adaptive clocking architecture 704 may be implemented in embedded systems and/or devices for automotive, mobile, computer, server and Internet-of-things (IoT) applications, including remote sensor nodes.

As shown in FIG. 7, the adaptive clocking architecture 704 may refer to elastic stretch clocking architecture for various circuit related applications. The adaptive clocking architecture 704 may include adaptive clocking (elastic stretch) architecture 604A from FIG. 6A along with pulser 714, reset mux1, set mux2, output logic gate (L0) and output flip-flop latch (FF0). In some applications, as shown in FIG. 7, the mask reset signals (mask_reset<N:0>) may be output to the reset mux1 as reset selection signals, and also, the mask set signals (mask_set<N:0>) may be output to the set mux2 as a set selection signals. The pulser 714 may receive O<N:0> signals from the adaptive clocking (elastic stretch) architecture 604A and then provide mo[N:0] signals to the reset mux1 and the set mux2, wherein the reset mux1 provides m1_out signals to the logic gate (L0) based on the mask reset signals (mask_reset<N:0>), and wherein the set mux2 provides set edge signals to the clock input of the output latch (FF0) based on the mask set signals (mask_set<N:0>). Also, the output logic gate (L0) provides reset_edge signal to the reset input of the output latch (FF0) based on the m1_out signal and the QO signal from the data output of the output latch (FF0). Also, the data input (DO) of the output latch (FF0) may be coupled to the supply voltage (VDD).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having adaptive clocking architecture with multiple stages of latches and buffers coupled in a delay line configuration. In some instances, each latch may receive a delayed clock signal as data input and provide a sample out signal as a latched output based on a clock signal. Also, in some instances, each latch may provide a delayed edge of a next clock cycle so as to stretch the pulse width of the clock signal.

Described herein are various implementations of a device having adaptive clocking architecture with multiple stages of latches and logic gates that are coupled in a delay line. In some instances, each logic gate may provide a delayed clock signal based on a reset signal. Also, in some instances, each latch may receive the delayed clock signal as data input and provide a sample out signal in the delay line as a latched output based on a clock signal. Also, in some instances, each latch may provide a delayed edge in the delay line of a next clock cycle so as to stretch the pulse width of the clock signal.

Described herein are various implementations of a device having a clock controller that provides clock signals and reset signals based on an enable signal, an input reset signal and an input clock signal. The device may have a phase generator that generates output signals and sampling signals based on the clock signals and the reset signals from the clock controller. In some instances, the phase generator may include multiple stages of latches and logic gates coupled in a delay line configuration. Also, in some instances, each latch may receive a delayed clock signal as data input and provide a sample out signal as a latched output based on a clock signal. Also, each latch may provide a delayed edge of a next clock cycle so as to implement a state machine that calculates a delayed edge to be used to stretch the pulse width of the clock signal.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various related techniques described herein, other and further implementations may be devised in accordance with the disclosure herein, which may be determined by the claims that follow.

Although the subject matter has been described herein in language specific to structural features and/or methodological acts, it should be understood that the subject matter defined in the appended claims is not necessarily limited to the specific features or acts described above. Rather, specific features and acts described above are disclosed as example forms of implementing the claims.

What is claimed is:

1. A device comprising:

adaptive clocking architecture with a controller and multiple stages of latches and buffers coupled in a delay line configuration, wherein each latch receives a delayed clock signal as a data input and a clock signal as a clock input and provides a sample out signal as a latched output based on the clock signal, wherein each latch provides a delayed edge of a next clock cycle, and wherein the controller is configured to stretch a pulse width of the clock signal based on the delayed edge.

2. The device of claim 1, wherein:

each latch provides a position of the sample out signal as the latched output based on the clock signal, the position corresponds to the delayed edge of the next clock cycle and reflects an upper bound of edge delay, and the latches provide the sample out signal as a sampling output for use by the controller in generating a series of clock cycles of the clock signal with the stretched pulse width.

3. The device of claim 2, wherein:

the series of clock cycles have a series of delayed edges for each corresponding clock cycle and the controller stretches the pulse width of the clock signal based on the series of delayed edges.

4. The device of claim 2, wherein:

each latch provides a corresponding sample out signal position beginning with a starting edge of the latched output based on the clock signal, and each latch provides a starting edge value of the latched output as the sampling output, which is used by the controller to generate the series of clock cycles with the stretched pulse width.

5. The device of claim 2, wherein the series of clock cycles of the clock signal refers to a series of multiple clock cycles of the clock signal including a number of clock cycles that repeat.

6. The device of claim 1, wherein:

the multiple stages of latches and buffers include a number of stages including a first stage with a first latch and a first buffer, the first buffer receives the clock signal and provides a first delayed clock signal as a first data input to the first latch, and the first latch receives the first delayed clock signal and provides a first position of the sample out signal as a first latched output based on the clock signal.

7. The device of claim 6, wherein:
the multiple stages of latches and buffers include a second stage with a second latch and a second buffer,
the second buffer receives the first delayed clock signal and provides a second delayed clock signal as a second data input to the second latch, and
the second latch receives the second delayed clock signal and provides a second position of the sample out signal as a second latched output based on the clock signal.
8. The device of claim 7, wherein:
the multiple stages of latches and buffers include a third stage with a third latch and a third buffer,
the third buffer receives the second delayed clock signal and provides a third delayed clock signal as a third data input to the third latch, and
the third latch receives the third delayed clock signal and provides a third position of the sample out signal as a third latched output based on the clock signal.
9. The device of claim 8, wherein:
the multiple stages of latches and buffers include a fourth stage with a fourth latch and a fourth buffer,
the fourth buffer receives the third delayed clock signal and provides a fourth delayed clock signal as a fourth data input to the fourth latch, and
the fourth latch receives the fourth delayed clock signal and provides a fourth position of the sample out signal as a fourth latched output based on the clock signal.
10. The device of claim 9, wherein:
the multiple stages of latches and buffers include a number of additional stages with each additional stage having an additional latch and an additional buffer,
each additional buffer receives a delayed clock signal from a previous buffer and provides the delayed clock signal as another data input to each additional latch, and
each additional latch receives the delayed clock signal and provides a position of the sample out signal as a latched output based on the clock signal.
11. A device comprising:
adaptive clocking architecture with a controller and multiple stages of latches and logic gates that are coupled in a delay line,
wherein each logic gate provides a delayed clock signal based on a reset signal,
wherein each latch receives the delayed clock signal as a data input and a clock signal as a clock input and provides a sample out signal in the delay line as a latched output based on the clock signal,
wherein each latch provides a delayed edge in the delay line of a next clock cycle, and
wherein the controller is configured to stretch a pulse width of the clock signal based on the delayed edge.
12. The device of claim 11, wherein:
the latches provide a position of the sample out signal in the delay line as a sampling output, and
the latches provide the sample out signal as a sampling output for use by the controller in generating a series of clock cycles of the clock signal that repeat.
13. The device of claim 12, wherein:
the series of clock cycles have a series of delayed edges for each corresponding clock cycle and the controller stretches a pulse period of the clock signal using the series of delayed edges.
14. The device of claim 12, wherein:
each latch provides a corresponding sample out signal beginning with a starting edge of the latched output based on the clock signal, and
each latch provides the starting edge of the latched output as the sampling output for use by the controller in generating the series of clock cycles with the stretched pulse width.
15. The device of claim 11, wherein:
the multiple stages of latches and logic gates include a first stage with a first latch and a first logic gate,
the first logic gate receives the clock signal, receives a first reset signal, and provides a first delayed clock signal as a first data input to the first latch, and
the first latch receives the first delayed clock signal and provides a position of a first sample out signal as a first latched output based on the clock signal.
16. The device of claim 15, wherein:
the multiple stages of latches and logic gates include a second stage with a second latch and a second logic gate,
the second logic gate receives the first delayed clock signal, receives a second reset signal, and provides a second delayed clock signal as a second data input to the second latch, and
the second latch receives the second delayed clock signal and provides a position of a second sample out signal as a second latched output based on the clock signal.
17. The device of claim 16, wherein:
the multiple stages of latches and logic gates include a third stage with a third latch and a third logic gate,
the third logic gate receives the second delayed clock signal, receives a third reset signal, and provides a third delayed clock signal as a third data input to the third latch, and
the third latch receives the third delayed clock signal and provides a position of a third sample out signal as a third latched output based on the clock signal.
18. The device of claim 17, wherein:
the multiple stages of latches and logic gates include a fourth stage with a fourth latch and a fourth logic gate,
the fourth logic gate receives the third delayed clock signal, receives a fourth reset signal, and provides a fourth delayed clock signal as a fourth data input to the fourth latch, and
the fourth latch receives the fourth delayed clock signal and provides a position of a fourth sample out signal as a fourth latched output based on the clock signal.
19. The device of claim 18, wherein:
the multiple stages of latches and logic gates include a number of additional stages with each additional stage having an additional latch and an additional logic gate,
each additional logic gate receives a delayed clock signal from a previous logic gate and provides the delayed clock signal as another data input to each additional latch,
each additional latch receives the delayed clock signal and provides a sample out signal as a latched output based on the clock signal, and
state calculations depend on output of the latches which provide an upper bounded position of each edge in the delay line.
20. A device comprising:
a clock controller that provides clock signals and reset signals based on an enable signal, an input reset signal and an input clock signal; and
a phase generator that generates output signals and sampling signals based on the clock signals and the reset signals from the clock controller, wherein the phase generator includes multiple stages of latches and logic gates coupled in a delay line configuration, wherein each latch receives a delayed clock signal as data input and provides a sample out signal as a latched output based on a clock signal, and each latch provides a delayed edge of a next clock cycle to enable a state machine to calculate a delayed edge to be used to stretch the pulse width of the clock signal.

* * * * *